United States Patent
Chen et al.

(10) Patent No.: US 12,230,480 B2
(45) Date of Patent: Feb. 18, 2025

(54) DETACHING AND INSTALLING DEVICE FOR GAS DISTRIBUTION PLATE OF ETCHING MACHINE, AND ETCHING MACHINE

(71) Applicant: CHANGXIN MEMORY TECHNOLOGIES, INC., Hefei (CN)

(72) Inventors: Ko Wei Chen, Hefei (CN); Li Meng, Hefei (CN); Chien Chung Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 650 days.

(21) Appl. No.: 17/508,862

(22) Filed: Oct. 22, 2021

(65) Prior Publication Data
US 2022/0134362 A1    May 5, 2022

Related U.S. Application Data

(63) Continuation of application No. PCT/CN2021/098719, filed on Jun. 7, 2021.

(30) Foreign Application Priority Data

Nov. 2, 2020 (CN) .......................... 202011206010.2

(51) Int. Cl.
*H01J 37/32* (2006.01)
*C23C 16/455* (2006.01)

(52) U.S. Cl.
CPC .... *H01J 37/3244* (2013.01); *C23C 16/45565* (2013.01); *H01J 37/32807* (2013.01); *H01J 37/3288* (2013.01)

(58) Field of Classification Search
None
See application file for complete search history.

(56) References Cited

U.S. PATENT DOCUMENTS 3,782,620 A * 1/1974 Eichholz ............... B65D 5/4604
229/125.41
5,440,784 A * 8/1995 Hull ....................... A45C 13/26
16/114.1

(Continued)

FOREIGN PATENT DOCUMENTS

CN    104995719 A    10/2015
CN    205529030 U    8/2016

(Continued)

OTHER PUBLICATIONS

English Machine Translation of KR20070097767A retrieved from Espacenet on Apr. 29, 2024 (Year: 2024).*

(Continued)

*Primary Examiner* — Ram N Kackar
*Assistant Examiner* — Laureen Chan
(74) *Attorney, Agent, or Firm* — Syncoda LLC; Feng Ma (57) ABSTRACT

The present application provides a detaching and installing device for a gas distribution plate of an etching machine, and the etching machine, and relates to the field of semiconductor manufacturing technologies, aiming at addressing the problems that it is quite difficult to detach and install the gas distribution plate of the etching machine and that the gas distribution plate is highly likely to be polluted. The detaching and installing device for the gas distribution plate of the etching machine includes a gripping member, a connecting member and a fixing member, the fixing member is detachably connected to the gas distribution plate of the etching machine, and the gripping member and the fixing member are connected through the connecting member; the gripping member is provided thereon with a gripping portion for grip by a user hand.

14 Claims, 5 Drawing Sheets

(56) References Cited

U.S. PATENT DOCUMENTS

| | | | | |
|---|---|---|---|---|
| 6,700,089 B1* | 3/2004 | Hirooka | ............ | H01L 21/67069 |
| | | | | 219/121.52 |
| 2005/0258280 A1* | 11/2005 | Goto | .................. | H01J 37/3244 |
| | | | | 239/548 |
| 2006/0108069 A1* | 5/2006 | Gernert | ............... | H01L 21/3065 |
| | | | | 156/345.34 |
| 2011/0083809 A1* | 4/2011 | de la Llera | ....... | H01J 37/32091 |
| | | | | 156/345.34 |
| 2019/0300345 A1* | 10/2019 | Barner | ...................... | B66F 3/12 |

FOREIGN PATENT DOCUMENTS

| | | | | |
|---|---|---|---|---|
| CN | 106910619 A | 6/2017 | | |
| CN | 107895843 A | 4/2018 | | |
| KR | 20070097767 A | * 10/2007 | .......... | H01J 37/3244 |
| KR | 101232197 B1 | 2/2013 | | |

OTHER PUBLICATIONS

International Search Report in Application No. PCT/CN2021/098719, mailed on Sep. 15, 2021.

* cited by examiner

DETACHING AND INSTALLING DEVICE FOR GAS DISTRIBUTION PLATE OF ETCHING MACHINE, AND ETCHING MACHINE

CROSS-REFERENCE TO RELATED APPLICATIONS

This application is a continuation of International Application No. PCT/CN2021/098719 filed on Jun. 7, 2021, which claims priority to Chinese Patent Application No. 202011206010.2 filed on Nov. 2, 2020. The disclosures of these applications are hereby incorporated by reference in their entirety.

BACKGROUND

Etching machines are a class of instruments commonly used in the fields of semiconductor processing and microelectronic manufacturing. Typically, an etching machine is designed to utilize plasma etching to accelerate, through an electric field, plasmas generated by ionized gases, thereby bombarding a wafer surface to be etched to finish wafer etching.

At present, an etching machine includes a vacuum chamber, an etching cavity, a gas supply system and a vacuum system. The etching cavity is arranged in the vacuum chamber, and the gas supply system is connected with the etching cavity and controls the flow velocity and flow rate of gases. A wafer chuck is arranged in the etching cavity to fix and heat up a wafer to be etched. The vacuum system is connected with the etching cavity and the vacuum chamber, respectively, thus ensuring the presence of a vacuum environment for the etching cavity and the vacuum chamber. Gas duct and a gas distribution plate are arranged in the gas supply system, and gas outlets of the gas ducts are communicated with gas holes of the gas distribution plate. During a maintenance process of the etching machine, the gas distribution plate needs to be detached for cleaning or maintenance. The gas distribution plate is generally fixed on a housing of the gas supply system by screw connection, so at the time of detachment and installation, it is required that screws at positions where the gas distribution plate and the housing are connected are detached or installed manually.

Yet, the current detaching and installing approaches for the gas distribution plate could easily cause pollutions to the gas distribution plate and the etching cavity of the etching machine, affect the etching effect of wafers in a negative way, and reduce the maintenance efficiency of the etching machine.

SUMMARY

The present invention relates to the field of semiconductor manufacturing technologies, and in particular to a detaching and installing device for a gas distribution plate of an etching machine, and the etching machine.

To address at least one problem mentioned in the Background, the present application provides a detaching and installing device for a gas distribution plate of an etching machine, and the etching machine. According to the present application, the difficulty of detaching and installing the gas distribution plate is lowered, the maintenance efficiency of the etching machine is enhanced, pollutions to the gas distribution plate during the detaching and installing process are reduced, the maintenance effect of the etching machine is optimized, the etching effect of the etching machine is ensured, and the service life of the etching machine is extended.

In order to achieve the objects listed above, in a first aspect, the present application provides a detaching and installing device for a gas distribution plate of an etching machine, which includes a gripping member, a connecting member and a fixing member. The fixing member is detachably connected to the gas distribution plate of the etching machine, and the gripping member and the fixing member are connected through the connecting member.

The gripping member is provided thereon with a gripping portion for grip by a user hand.

In a second aspect, the present application provides an etching machine including a vacuum reaction chamber, and a gas distribution plate and the above-mentioned detaching and installing device for the gas distribution plate of the etching machine are arranged within the reaction chamber; a fixing member of the detaching and installing device for the gas distribution plate of the etching machine is detachably connected to the gas distribution plate.

The structure of the present application and its other inventive objects and beneficial effects will be more apparent through a description of the preferred embodiments in conjunction with the accompanying drawings.

BRIEF DESCRIPTION OF THE DRAWINGS

In order to more clearly illustrate the embodiments of the present application or the technical solutions of the traditional technology, the accompanying drawings required to be used in the description of the embodiments or traditional techniques will be briefly introduced below. Apparently, the accompanying drawings in the following description show merely some embodiments of the present application, and persons of ordinary skill in the art may still derive other drawings from these accompanying drawings without creative efforts.

DETAILED DESCRIPTION

It has been found by the inventor of the present application during practical research that, a current etching machine includes a vacuum chamber, an etching cavity, a gas supply system and a vacuum system. The etching cavity is arranged in the vacuum chamber, and the gas supply system is connected with the etching cavity and controls the flow velocity and flow rate of gases. A wafer chuck is arranged in the etching cavity to fix and heat up a wafer to be etched. The vacuum system is connected with the etching cavity and the vacuum chamber, respectively, thus ensuring the presence of a vacuum environment for the etching cavity and the vacuum chamber. Gas ducts and a gas distribution plate are arranged in the gas supply system, and gas outlets of the gas ducts are communicated with gas holes of the gas distribution plate. During a maintenance process of the etching machine, the gas distribution plate needs to be detached for cleaning or maintenance. The gas distribution plate is generally fixed on a housing of the gas supply system by screw connection, so at the time of detachment and installation, it is required that screws at positions where the gas distribution plate and the housing are connected are detached or installed manually. In general, the user needs to manually press the gas distribution plate and tighten or loosen the screws at the same time, to ensure solid detachment and installation of the gas distribution plate. However, in the current detaching and installing approaches for the gas distribution plate, pollutions to the gas distribution plate could easily occur when the user presses the gas distribution plate with his/her hand, as a result of which pollutions to the etching cavity of the etching machine are caused, the etching effect of wafers is affected in a negative way, and also the maintenance efficiency of the etching machine is reduced.

In view of this, in the detaching and installing device for the gas distribution plate of the etching machine, and the etching machine, according to the embodiments of the present application, a direct contact of the user hand with the gas distribution plate during the process of detaching and installing the gas distribution plate is avoided by detachably connecting the fixing member to the gas distribution plate in the detaching and installing device. Meanwhile, with the gripping portion being arranged and gripped by the user hand, pollutions to the gas distribution plate caused by the hand are prevented and the impacts of the fixing member on the structure and usage procedure of the gas distribution plate are reduced. The difficulty of connecting the gripping member with the fixing member is lowered by arranging the connecting member between the gripping member and the fixing member, and also the spacing between the fixing member and the gripping member is increased to avoid such a situation that the user hand comes into contact with the gas distribution plate while gripping the gripping member. Furthermore, the connecting member and the fixing member can be driven to move by the gripping member, such that the fixing member drives movement of the gas distribution plate, and the difficulty of detaching and installing the gas distribution plate is lowered. The maintenance efficiency of the etching machine is enhanced, the maintenance effect of the etching machine is optimized, the etching effect of the etching machine is ensured, and the service life of the etching machine is extended.

For a better clarity of the objects, technical solutions and advantages of the present application, the technical solutions in the embodiments of the present application will be described in more detail below in conjunction with the accompanying drawings in the preferred embodiments of the present application. Throughout the drawings, identical or similar reference numerals indicate identical or similar components or components with identical or similar functions. The embodiments described are a part of the embodiments of the present application, rather than all of the embodiments. The embodiments described below with reference to the drawings are exemplary and are intended to explain the present application, but cannot be understood as a limitation to the present application. Based upon the embodiments in the present application, all other embodiments obtained by those of ordinary skill in the art without creative efforts shall fall within the protection scope of the present application. The embodiments of the present application will be described in detail below with reference to the accompanying drawings.

Figure 1:
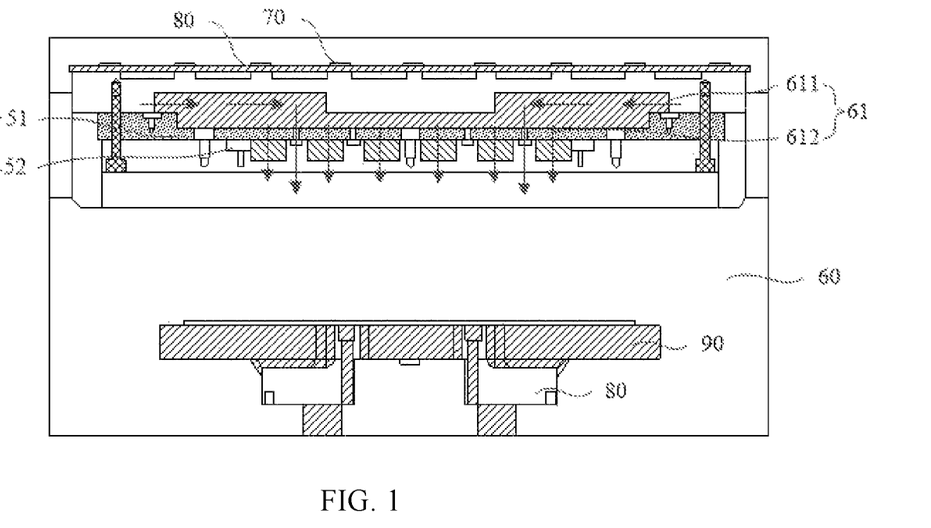
FIG. 1 is a schematic structural diagram of the reaction chamber of the etching machine according to the embodiments of the present application.
Figure 2:
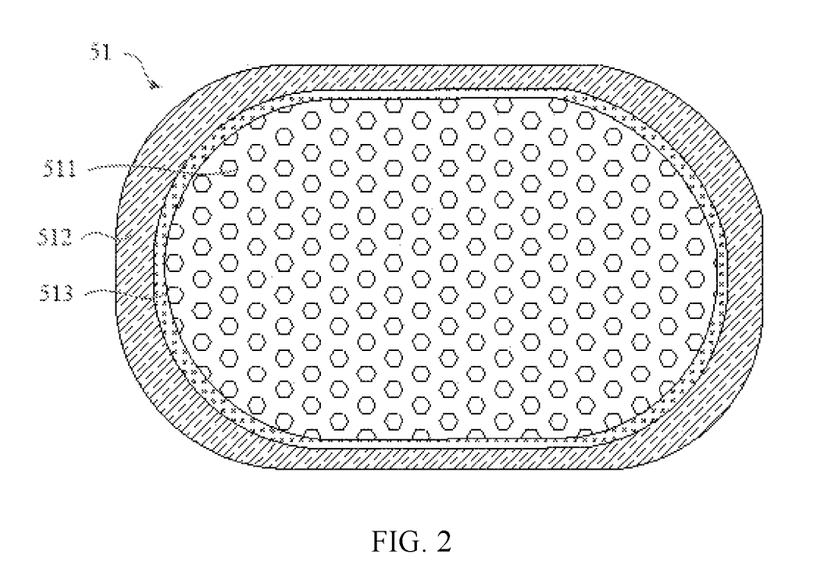
FIG. 2 is a schematic structural diagram of the gas distribution plate of the etching machine according to the embodiments of the present application.
Figure 3:
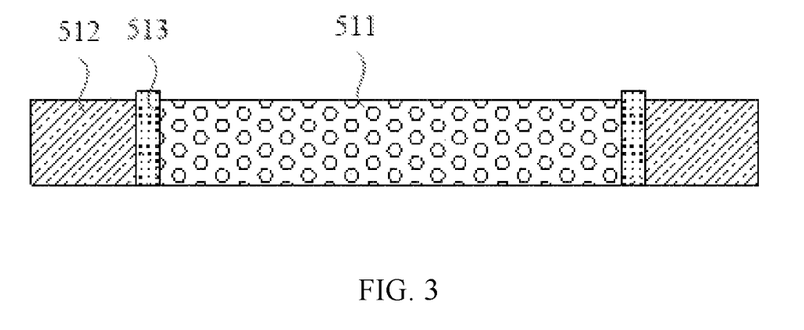
FIG. 3 is a side view of the gas distribution plate of the etching machine according to the embodiments of the present application.
Figure 4:
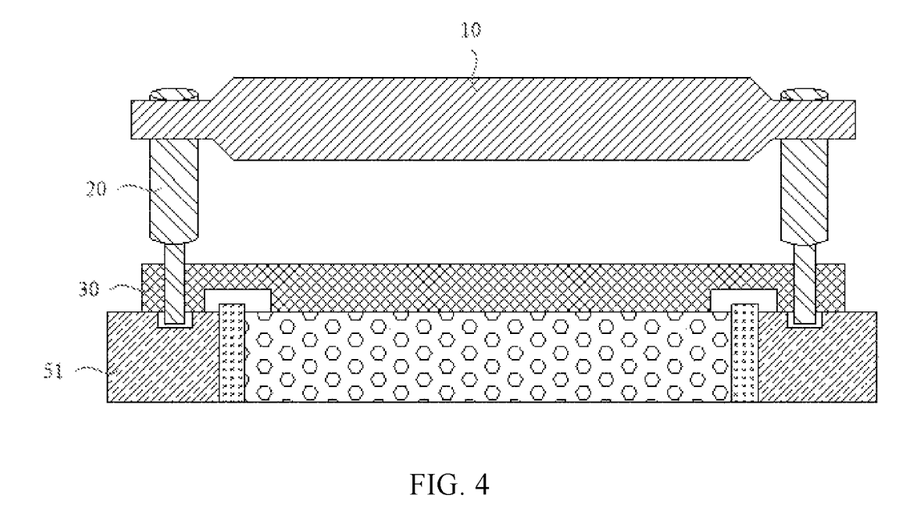
FIG. 4 is a schematic structural diagram of the detaching and installing device for the gas distribution plate of the etching machine according to the embodiments of the present application, which is installed on the gas distribution plate.
Figure 5:
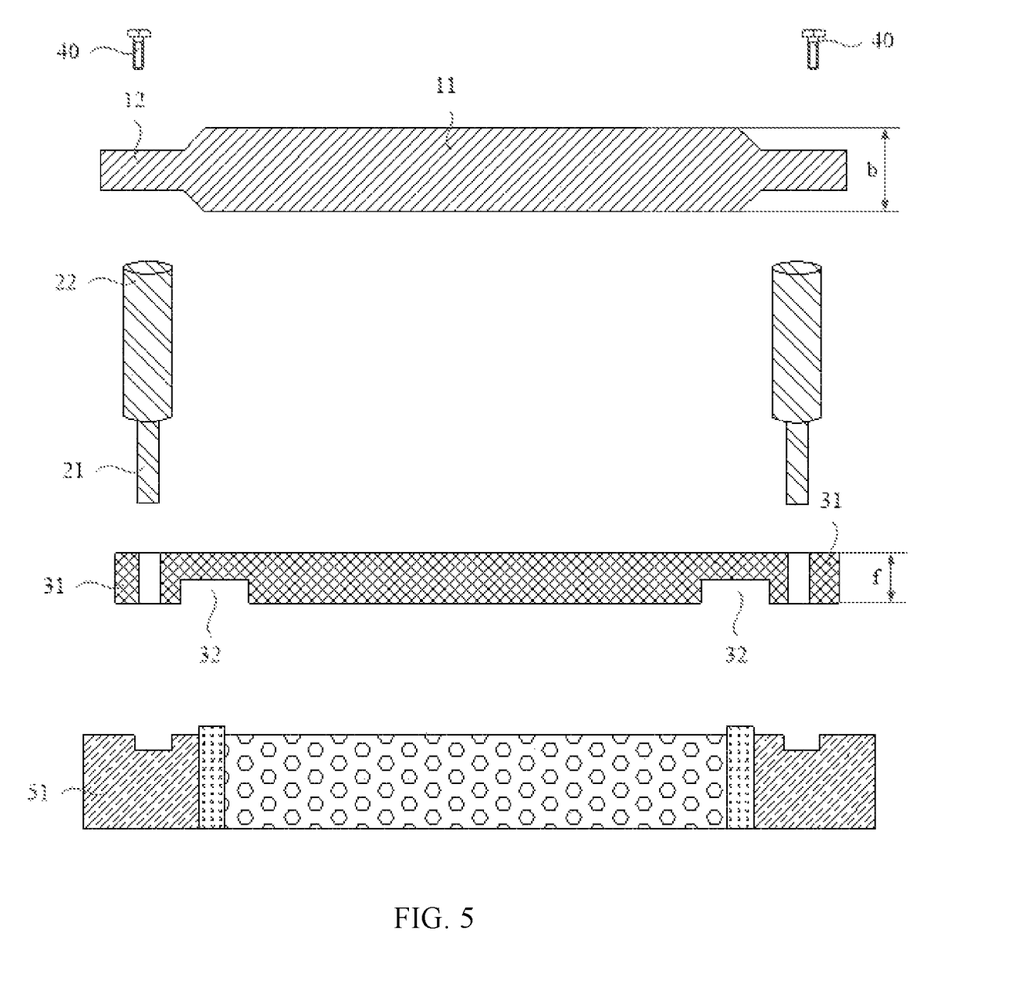
FIG. 5 is an exploded view of the detaching and installing device for the gas distribution plate of the etching machine according to the embodiments of the present application, and the gas distribution plate.
Figure 6:
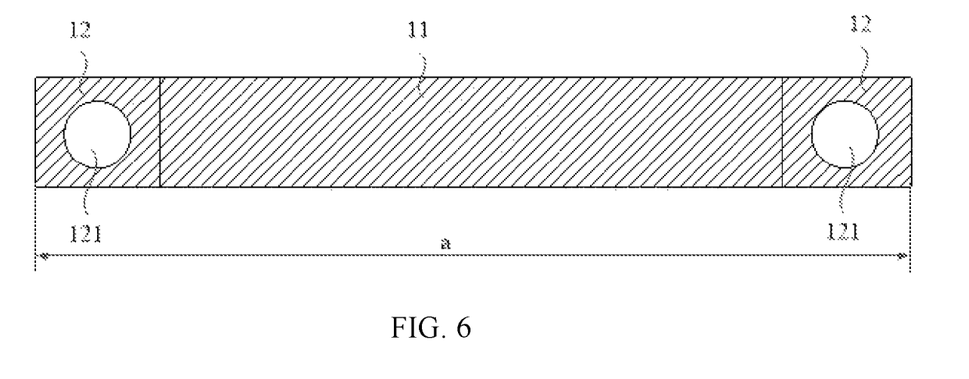
FIG. 6 is a schematic structural diagram of the gripping member of the detaching and installing device for the gas distribution plate of the etching machine according to the embodiments of the present application.
Figure 7:
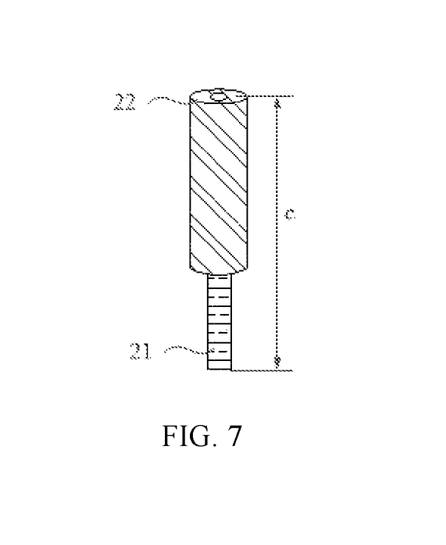
FIG. 7 is a schematic structural diagram of the connecting member of the detaching and installing device for the gas distribution plate of the etching machine according to the embodiments of the present application.
Figure 8:
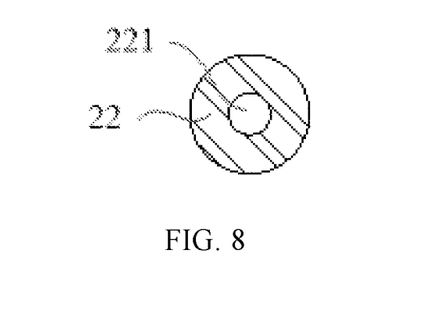
FIG. 8 is a top view of the connecting member of the detaching and installing device for the gas distribution plate of the etching machine according to the embodiments of the present application.
Figure 9:
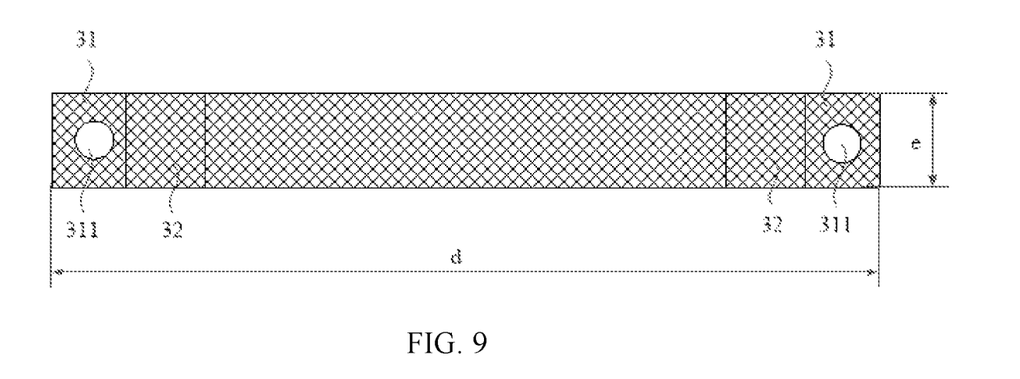
FIG. 9 is a schematic structural diagram of the fixing member of the detaching and installing device for the gas distribution plate of the etching machine according to the embodiments of the present application.
Figure 10:
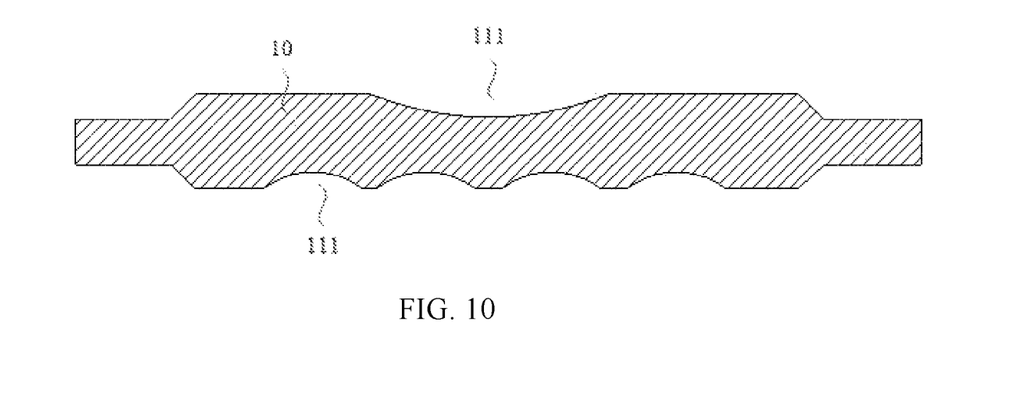
FIG. 10 is a schematic structural diagram of the gripping member of another implementation of the detaching and installing device for the gas distribution plate of the etching machine according to the embodiments of the present application.

FIG. 1 is a schematic structural diagram of the reaction chamber of the etching machine according to the embodiments of the present application. FIG. 2 is a schematic structural diagram of the gas distribution plate of the etching machine according to the embodiments of the present application. FIG. 3 is a side view of the gas distribution plate of the etching machine according to the embodiments of the present application. FIG. 4 is a schematic structural diagram of the detaching and installing device for the gas distribution plate of the etching machine according to the embodiments of the present application, which is installed on the gas distribution plate. FIG. 5 is an exploded view of the detaching and installing device for the gas distribution plate of the etching machine according to the embodiments of the present application, and the gas distribution plate. FIG. 6 is a schematic structural diagram of the gripping member of the detaching and installing device for the gas distribution plate of the etching machine according to the embodiments of the present application. FIG. 7 is a schematic structural diagram of the connecting member of the detaching and installing device for the gas distribution plate of the etching machine according to the embodiments of the present application. FIG. 8 is a top view of the connecting member of the detaching and installing device for the gas distribution plate of the etching machine according to the embodiments of the present application. FIG. 9 is a schematic structural diagram of the fixing member of the detaching and installing device for the gas distribution plate of the etching machine according to the embodiments of the present application. FIG. 10 is a schematic structural diagram of the gripping member of another implementation of the detaching and installing device for the gas distribution plate of the etching machine according to the embodiments of the present application.

With reference to FIG. 1 to FIG. 10, provided in the embodiment of the present application is a detaching and installing device for a gas distribution plate 50 of an etching machine, which includes a gripping member 10, a connecting member 20 and a fixing member 30. The fixing member 30 is detachably connected to the gas distribution plate 50 of the etching machine, and the gripping member 10 and the fixing member 20 are connected through the connecting member 30. The gripping member 10 is provided thereon with a gripping portion 11 for grip by a user hand.

It should be noted that the detaching and installing device according to this embodiment is mainly configured to detach and install the gas distribution plate 50 of the etching machine. This etching machine may include a vacuum reaction chamber 60, the vacuum reaction chamber 60 has a chamber opening on which a chamber lid is detachably arranged, an inner liner is detachably arranged on an inner wall of the reaction chamber 60 and may improve the vacuum environment for the reaction chamber 60, and meanwhile an etching cavity is formed inside the vacuum reaction chamber 60. The reaction chamber 60 is provided therein with a gas supply system 61 and a vacuum system. The gas supply system 61 may include a plurality of gas ducts that are communicated with the gas distribution plate 50 in the reaction chamber 60, and one or more halogen gases or fluorine-based gases are fed into the gas ducts. By referring to FIG. 1, the gas supply system 61 in this embodiment may include two gas ducts, i.e., a first gas duct 611 and a second gas duct 612. Different types of gases may be circulated in the first gas duct 611 and the second gas duct 612, respectively, for example, a hydrogen fluoride gas may be circulated in the first gas duct 611 and an ammonia gas may be circulated in the second gas duct 612. The types of gases in the gas supply system 61 are neither limited in this embodiment nor limited to the above examples.

An electric field system 70 is arranged within the reaction chamber 60 and may be an energized coil located at the top of the reaction chamber 60. An end of the energized coil is connected with an electrode tab that can create a high-pressure electric field within the reaction chamber 60. In general, the energized coil includes an inner loop coil close to the center of the reaction chamber 60 and an outer loop coil close to the edge of the reaction chamber 60. Electric field distribution in the reaction chamber 60 is regulated by controlling energizing currents in the inner loop coil and the outer loop coil, so as to improve the uniformity of electric field distribution in the reaction chamber 60.

A chuck 90 is arranged in the reaction chamber 60, a wafer to be etched is generally fixed to the chuck 90 by means of electrostatic adsorption, the surface of the wafer to be etched may be arranged opposite the gas distribution plate 50, and gas outlets of the gas distribution plate 50 may face towards the surface of the wafer to be etched. During the etching process, the gas ejected from the gas distribution plate 50 will be ionized under the effect of a high-frequency electric field to produce negatively charged electrons and positively charged electrons, thereby creating high-energy plasmas. These plasmas bombard the surface of the wafer to be etched and knock out the atoms of the wafer to be etched, or undergo chemical reactions to bring about new compound volatilization along with the material of the surface of the wafer to be etched, and in this way etching is realized.

Also, a heating system 80 is arranged in the reaction chamber 60. This heating system 80 may be located at a side in the reaction chamber 60 close to the gas supply system 61, for heating the gas supply system 61, or at a side close to the chuck 90, for heating the wafer to be etched.

To ensure etching uniformity, it is generally required that the uniformity of electric fields and the uniformity of gas distribution are regulated, wherein the uniformity of gas distribution needs to be achieved by the gas distribution plate 50 and also by regulating the parameters of the gas outlets on the gas distribution plate 50, such as position, gas ejection flow rate, etc. A plurality of gas outlets are present on the gas distribution plate 50 and are arranged at intervals.

Referring to FIG. 1 to FIG. 3, a plurality of gas distribution plates 50 may be included and may be stacked up, and the gas ducts on two adjacent gas distribution plates 50 may be communicated with each other. In this embodiment, the gas distribution plates 50 may include a first gas distribution plate 51 and a second gas distribution plate 52 that may be stacked up, and the gas that passes through a plurality of gas distribution plates 50 results in a higher distribution uniformity. With reference to FIG. 1, in this embodiment, the first gas distribution plate 51 may include an inner plate 511 and an outer ring plate 512 surrounding the inner plate 511, and the inner plate 511 and the outer ring plate 512 are connected. Both the inner plate 511 and the outer ring plate 512 of the gas distribution plate 50 may be provided thereon with gas outlets, different types of gases may be circulated in the inner plate 511 and the outer ring plate 512, respectively, and this is not limited in this embodiment. The inner plate 511 and the outer ring plate 512 may be connected with each other via a fastener, the connection means for this fastener may include but not limited to snap connection, threaded connection, and pin connection.

To ensure the structural stability of the gas distribution plate 50, a seal 513 may be arranged between the inner plate 511 and the outer ring plate 512. The seal 513 may be a seal ring and a seal gasket, the material for the seal 513 may be resin or rubber which can be arranged, under a state of interference fit, at a connection gap of the inner plate 511 and the outer ring plate 512, and the seal 513 may improve the sealing property at the connection gap of the inner plate 511 and the outer ring plate 512, in order to enhance the structural stability of the gas distribution plate 50 and prevent the gas leakage issue at the connection gap of the gas distribution plate 50. To ensure this sealing effect, the seal 513 is generally arranged in the form of a convex connection gap, i.e., the surface of the seal 513 is higher than the surface of the gas distribution plate 50.

The gas distribution plate 50 is typically installed in the reaction chamber 60 for purposes of reducing the difficulty of detaching and installing the gas distribution plate 50 and avoiding causing pollutions to the gas distribution plate 50 at the same time. This embodiment is implemented by the detaching and installing device, during the detaching and installing process of the gas distribution plate 50 of the etching machine. The detaching and installing device of this embodiment is fixed to the gas distribution plate 50 when the gas distribution plate 50 needs to be detached or installed, whereas during the operation of the etching machine, this detaching and installing device is not fixed to the gas distribution plate 50.

It shall be noted that the fixing member 30 of the detaching and installing device may be connected to the gas distribution plate 50, which can avoid the contact of a user hand with this gas distribution plate 50. In particular, the fixing member 30 includes at least one fixing portion 31 that is detachably connected to the gas distribution plate 50. The detachable connection between the fixing portion 31 and the gas distribution plate 50 may lower the difficulty of connecting the detaching and installing device with the gas distribution plate 50, while at the same time ensuring the normal usage procedure of the gas distribution plate 50.

By referring to FIG. 4, the fixing member 30 extends in a first direction, and there are two fixing portions 31 located respectively on two opposite ends of the fixing member 30 in the first direction. The connecting member 20 is connected with the fixing portions 31 of the fixing member. It shall be noted that, by, in this embodiment, arranging the fixing portions 31 on the two opposite ends of the fixing member 30 in the first direction, respectively, the area for connection of the fixing portions 31 and the gas distribution plate 50 may be increased and the stability of the connection of the fixing portions 31 and the gas distribution plate 50 is ensured. Meanwhile, based upon the fact that the connection positions for the fixing member 30 and the gas distribution plate 50 are at the two fixing portions 31, the stability of the detaching and installing device during removal for the gas distribution plate 50 can be ensured, those situations such as offset, inclination, etc. during the detaching and installing process of the gas distribution plate 50 can be avoided, and the risk that the gas distribution plate 50 is damaged can be lowered.

The two fixing portions 31 of the fixing member 30 are detachably connected to different positions of the outer ring plate 512, and a projection of the fixing member 30 on the gas distribution plate 50 covers at least a part of the inner plate 511. Such an arrangement may achieve simultaneous detachment and installation for the inner plate 511 and the outer ring plate 512 by utilizing the detaching and installing device, and thus the detaching and installing efficiency is improved.

With reference to FIG. 7 and FIG. 8, the connecting member 20 includes a first connecting end 21 and a second connecting end 22, the first connecting end 21 is connected with the fixing portions 31 of the fixing member 30 and the second connecting end 22 is connected with the gripping member 10. The first connecting end 21 and the second connecting end 22 may respectively be two opposite ends of the connecting member 20 in its own extending direction. It shall be noted that since, in this embodiment, the connecting member 20 is arranged between the gripping member 10 and the fixing member 30 and the first connecting end 21 and the second connecting end 22 of the connecting member 20 are respectively connected with the fixing portions 31 and the gripping member 10, the spacing between the gripping member 10 and the fixing member 30 can be increased. On the one hand, such an arrangement may lead to a larger spacing between the user hand and the fixing member 30 while the gripping member 10 is gripped by the user hand, and lower the risk that the gas distribution plate 50 is polluted by the hand. On the other hand, such an arrangement may also avoid the influences from the fixing member 30 while the gripping member 10 is gripped by the user hand, thereby improving the comfort level during the grip by the user hand.

The two opposite connecting ends of the connecting member 20 are connected with the fixing member 30 and the gripping member 10, respectively, such that the structural flexibility of this detaching and installing device may be improved effectively and the state of connection of the detaching and installing device may be timely adjusted as required by users, for example, the first connecting end 21 may be connected with the fixing portions 31 and the second connecting end 22 is separated from the gripping member 10, or vice versa, in order to meet the requirements of different detaching and installing procedures of the detaching and installing process.

As a realizable implementation, the first connecting end 21 is in threaded connection with the fixing portions 31, a first outer thread is provided on the first connecting end 21, and the fixing portion 31 is provided thereon with a first connecting hole 311 in which a first inner thread engaged with the first outer thread is provided. It shall be noted that with the threaded connection being achieved between the first connecting end 21 and the fixing portions 31, the operability of the connection process of the connecting member 20 and the fixing member 20 can be improved, the difficulty of achieving the connection therebetween can be lowered, and thus the assembly efficiency of this detaching and installing device can be increased. The first connecting end 21 can penetrate through the first connecting hole 311 and then is in threaded connection with the gas distribution plate 50, such that the detaching and installing device is fixed to the gas distribution plate 50.

In particular, referring to FIG. 6, the gripping member 10 extends in the first direction, connecting portions 12 are respectively arranged on the two opposite ends of the gripping member 10 in the first direction, and the gripping portion 11 is located between the two connecting portions 12. The connecting portions 12 are connected with the second connecting end 22 via fasteners 40.

It shall be noted that the gripping member 10 has the same extending direction as that of the fixing member 30, so the structural complexity of the detaching and installing device may be reduced and also, the difficulty of connecting the gripping member 10 with the fixing member 30 through the connecting member 20 may be lowered. Based upon the fact that the connecting portions 12 of the two connecting ends of the gripping member 10 are connected with the second connecting end 22 of the connecting member 20, the stability of the connection between the gripping member 10 and the connecting member 20 can be improved, in order to guarantee the stationarity of the gripping member 10 during removal of the gas distribution plate 50.

With reference to FIG. 5, the second connecting end 22 is provided thereon with a second connecting hole 221, the connecting portion 12 is provided thereon with a third connecting hole 121, and the third connecting hole 121 is a through hole. The fastener 40 penetrates through the third connecting hole 121 and is in threaded connection with the second connecting hole 221.

It shall be noted that the difficulty of connecting the second connecting end 22 with the fastener 40 can be lowered by the threaded connection therebetween, the fastener 40 can sandwich the connecting portion 12 of the gripping member 10 between the fastener 40 and the connecting member 20, thus realizing the connection between the connecting portion 12 and the connecting member 20.

It shall be noted that the fastener 40 and the second connecting hole 221 of the connecting member 20 have threads with the same direction of rotation and are engaged with each other. The first connecting end 21 and the first connecting hole 311 have threads with the same direction of rotation and are engaged with each other. The fastener 40 and the first connecting end 21 may have threads with opposite directions of rotation, such that it can be avoided that the connection process of the fastener 40 and the second connecting end 22 and the connection process of the first connecting end 21 and the fixing portions 31 mutually influence each other, and also a self-locking function of this detaching and installing device is realized.

As a realizable implementation, with reference to FIG. 10, the gripping portion 11 is of a cylindrical structure, and at least one recessed portion 111 for receiving a user hand is arranged on an outer surface of the gripping portion 11. It shall be noted that the shape and size of this recessed portion 111 may be adjusted according to the shape and size of a user hand, to ensure that the palm and the fingers can be located within this recessed portion 111 while the gripping portion 11 is gripped by the user hand. By doing so, not only can the stability when the gripping member 10 is gripped by the user hand be improved, but the user experience brought by this detaching and installing device is optimized.

With reference to FIG. 5, the seal 513 is arranged between the inner plate 511 and the outer ring plate 512 on the gas distribution plate 50 and protrudes from the surface of the gas distribution plate 50. Hence, to prevent that the fixing member 30 and the seal 513 mutually influence each other, in this embodiment, a notch 32 of at least one recess is arranged on the fixing member 30, and the notch 32 creates an avoidance area for the fixing member 30. This avoidance area may be configured to avoid this protruding seal 513, thus preventing the normal structure of the gas distribution plate 50 from being damaged or affected by installation of the detaching and installing device.

The notch 32 of the fixing member 30 is recessed towards a side away from the seal 513, and a projection of the notch 32 on the gas distribution plate 50 covers the seal 513. Such an arrangement may improve the sealing effect between the inner plate 511 and the outer ring plate 512, while avoiding any damage to the seal 513 by the detaching and installing device.

This avoidance area, during its actual use, may also be configured to avoid other structural members on the gas distribution plate 50, and this is not limited in this embodiment.

The notch 32 is located between the two fixing portions 31 of the fixing member 30. Since the notch 32 needs to be avoided, it needs to be as far away from the gas distribution plate 50 as possible. However, the fixing portions 31 need to be connected with the gas distribution plate 50, so they need to be as close to the gas distribution plate 50 as possible. To prevent a mutual influence between the notch 32 and the fixing portions 31, the notch 32 is arranged within a region between the two fixing portions 31 in this embodiment.

As a realizable implementation, the fixing member 30 and the connecting member 20 are polytetrafluoroethylene members. Such an arrangement may ensure that the fixing member 30 and the connecting member 20 have relatively excellent heat resistance, abrasion resistance and anti-surface tack effect. As a result, the structural stability of the fixing member 30 and the connecting member 20 is improved, adhesion of impurities to the fixing member 30 and the connecting member 20 is avoided, pollutions to the gas distribution plate 50 caused by the impurities adhered there to are avoided, and the cleanness of the gas distribution plate 50 is enhanced.

As a realizable implementation, the gripping member 10 is an aluminum piece or an aluminum alloy piece, a coating is arranged outside the gripping member 10, and the coating is a fluoride layer. Such an arrangement may ensure that the gripping member 10 has light weight and high strength in order to meet the gripping requirements. Further, due to the low cost of the aluminum piece or the aluminum alloy piece, the manufacturing cost of the entire detaching and installing device may be lowered.

As a realizable implementation, the fixing member 30 is of a cuboid structure, the fixing member 30 has a length in the first direction ranging from 300 mm to 350 mm, and the fixing member 30 has a width ranging from 20 mm to 50 mm and a thickness ranging from 10 mm to 15 mm. During actual use, the size of the fixing member 30 may be adjusted according to the size of the gas distribution plate 50. With reference to FIG. 9, the length of the fixing member 30 may be a portion as indicated by d, and the width may be a portion as indicated by e. By referring to FIG. 5, the thickness of the fixing member 30 may be a portion as indicated by f.

As a realizable implementation, the connecting member 20 has a length ranging from 40 mm to 60 mm. With reference to FIG. 7, the length of the connecting member 20 may be a portion as indicated by c. An excessively large length of the connecting member 20 leads to a larger overall volume of the detaching and installing device, which affects the convenience of installation. A too small length of the connecting member 20 results in a relatively small distance between the gripping member 10 and the fixing member 30, and also causes pollutions to the gas distribution plate 50 since the user hand is highly likely to come into contact with the gas distribution plate 50. During actual use, the specific value for the length of the connecting member 20 may be chosen by the user within the above range as desired, and this is not limited in this embodiment.

As a realizable implementation, the gripping member 10 has a length in the first direction ranging from 300 mm to 350 mm, and the gripping portion 11 has a diameter of 20 mm to 30 mm. With reference to FIG. 5 and FIG. 6, the length of the gripping member 10 in the first direction is a portion as indicated by a, and the diameter of the gripping portion 11 may be a portion as indicated by d. The above size limitations may ensure that the gripping member 10 has a relatively comfortable gripping effect.

In the above description, it is to be appreciated that the terms "install", "link", "connect", etc. should be understood in a broad sense, unless otherwise definitely stipulated or defined. For example, a connection may be a fixed connection, an indirect connection through an intermediate medium, or a connection inside two components or interaction between two components. For a person of ordinary skill in the art, specific meanings of the previous terms in the present application can be understood based on a specific situation. The orientation or position relationship indicated by the terms "upper", "lower", "front", "rear", "vertical", "horizontal", "top", "bottom", "inner", "outer", etc. is the orientation or position relationship shown in the accompanying drawings and is intended to facilitate the description of the present application and simplify the description only, rather than indicating or implying that the apparatus or element referred to must have a particular orientation or be constructed and operated in a particular orientation, and therefore is not to be interpreted as limiting the present invention. In the description of the present application, "a plurality of" means two or more, unless otherwise specifically limited.

The terms "first", "second", "third", "fourth", etc. (if any) in the specification and claims of the present application and the above accompanying drawings are used to distinguish similar objects, without having to describe a specific order or sequence. It should be understood that the data used in this way can be interchanged where appropriate, so that the embodiments of the present application described herein can be implemented in an order other than those illustrated or described herein, for example. In addition, the terms "including" and "having" and any variations thereof are intended to cover non-exclusive inclusions. For example, processes, methods, systems, products or devices that contain a series of steps or units is not necessarily limited to those steps or units clearly listed, but may include other steps or units that are not clearly listed or are inherent to these processes, methods, products or devices.

Finally, it should be noted that the above embodiments are merely used to illustrate the technical solutions of the present application, rather than a limitation thereto; although the present application has been described in details with reference to the foregoing embodiments, those of ordinary skill in the art should understand that: modifications can still be made to the technical solutions described in the foregoing embodiments, or some or all of the technical features therein are equivalently substituted; however, these modifications or substitutions do not cause the nature of the corresponding technical solutions to deviate from the scope of the technical solutions of the embodiments of the present application.

What is claimed is:

1. A detaching and installing device for a gas distribution plate of an etching machine, comprising a gripping member, a connecting member and a fixing member, wherein the fixing member is detachably connected to the gas distribution plate of the etching machine, and the gripping member and the fixing member are connected through the connecting member;

the gripping member is provided thereon with a gripping portion for grip by a user hand;

wherein the fixing member comprises at least one fixing portion detachably connected to the gas distribution plate;

wherein the fixing member extends in a first direction, and there are two fixing portions located respectively on two opposite ends of the fixing member in the first direction; the connecting member is connected with the fixing portions of the fixing member;

wherein the connecting member comprises a first connecting end and a second connecting end, the first connecting end is connected with the fixing portions of the fixing member and the second connecting end is connected with the gripping member;

wherein the first connecting end is in threaded connection with the fixing portions, a first outer thread is provided on the first connecting end, and the fixing portion is provided thereon with a first connecting hole in which a first inner thread engaged with the first outer thread is provided.

2. The detaching and installing device for a gas distribution plate of an etching machine according to claim 1, wherein the two fixing portions of the fixing member are detachably connected to different positions of an outer ring plate, and a projection of the fixing member on the gas distribution plate covers at least a part of an inner plate.

3. The detaching and installing device for a gas distribution plate of an etching machine according to claim 2, wherein the gas distribution plate of an etching machine further comprises a seal arranged between the inner plate and the outer ring plate.

4. The detaching and installing device for a gas distribution plate of an etching machine according to claim 1, wherein the gripping member extends in the first direction, connecting portions are respectively arranged on the two opposite ends of the gripping member in the first direction, and the gripping portion is located between the two connecting portions;

the connecting portions are connected with the second connecting end via fasteners.

5. The detaching and installing device for a gas distribution plate of an etching machine according to claim 4, wherein the second connecting end is provided thereon with a second connecting hole, the connecting portion is provided thereon with a third connecting hole, and the third connecting hole is a through hole;

the fastener penetrates through the third connecting hole and is in threaded connection with the second connecting hole.

6. The detaching and installing device for a gas distribution plate of an etching machine according to claim 1, wherein the gripping portion is of a cylindrical structure, and at least one recessed portion for receiving a user hand is arranged on an outer surface of the gripping portion.

7. The detaching and installing device for a gas distribution plate of an etching machine according to claim 1, wherein a notch of at least one recess is arranged on the fixing member, and the notch creates an avoidance area for the fixing member.

8. The detaching and installing device for a gas distribution plate of an etching machine according to claim 7, wherein the notch of the fixing member is recessed towards a side away from a seal, and a projection of the notch on the gas distribution plate covers the seal.

9. The detaching and installing device for a gas distribution plate of an etching machine according to claim 7, wherein the notch is located between the two fixing portions of the fixing member.

10. The detaching and installing device for a gas distribution plate of an etching machine according to claim 1, wherein the fixing member and the connecting member are polytetrafluoroethylene members;

and/or the gripping member is an aluminum piece or an aluminum alloy piece, a coating is arranged outside the gripping member, and the coating is a fluoride layer.

11. The detaching and installing device for a gas distribution plate of an etching machine according to claim 1, wherein the fixing member is of a cuboid structure, the fixing member has a length in the first direction ranging from 300 mm to 350 mm, and the fixing member has a width ranging from 20 mm to 50 mm and a thickness ranging from 10 mm to 15 mm;

and/or the connecting member has a length ranging from 40 mm to 60 mm;

and/or the gripping member has a length in the first direction ranging from 300 mm to 350 mm, and the gripping portion has a diameter of 20 mm to 30 mm.

12. An etching machine, comprising a vacuum reaction chamber, wherein a gas distribution plate, and the detaching and installing device for the gas distribution plate of the etching machine according to claim 1, are arranged within the vacuum reaction chamber;

the fixing member of the detaching and installing device for the gas distribution plate of the etching machine is detachably connected to the gas distribution plate.

13. The etching machine according to claim 12, wherein the gas distribution plate comprises an inner plate and an outer ring plate surrounding the inner plate, and the inner plate and the outer ring plate are connected;

the two fixing portions of the fixing member are detachably connected to different positions of the outer ring plate, and a projection of the fixing member on the gas distribution plate covers at least a part of the inner plate.

14. The etching machine according to claim 13, wherein a seal is arranged between the inner ring plate and the outer ring plate, a notch of the fixing member is recessed towards a side away from the seal, and a projection of the notch on the gas distribution plate covers the seal.

* * * * *